United States Patent [19]

Chen

[11] Patent Number: 5,439,834
[45] Date of Patent: Aug. 8, 1995

[54] METHOD FOR FABRICATING A CMOS DEVICE WITH REDUCED NUMBER OF PHOTOLITHOGRAPHY STEPS

[75] Inventor: Heng-Tien Chen, Taipei, Taiwan

[73] Assignee: Winbond Electronics Corp., Hsinchu City, Taiwan

[21] Appl. No.: 340,264

[22] Filed: Nov. 15, 1994

[51] Int. Cl.⁶ .......................................... H01L 21/8238
[52] U.S. Cl. .......................................... 437/34; 437/44; 437/56; 437/58; 437/41; 148/DIG. 82
[58] Field of Search ................ 437/34, 44, 56, 57, 437/58, 41; 148/DIG. 82

[56] References Cited

U.S. PATENT DOCUMENTS

| | | | |
|---|---|---|---|
| 4,382,827 | 5/1983 | Romano-Moran et al. | 437/56 |
| 4,843,023 | 6/1989 | Chiu et al. | 437/44 |
| 5,010,030 | 4/1991 | Pfiester et al. | 437/34 |
| 5,015,595 | 5/1991 | Wollesen | 437/57 |
| 5,024,959 | 6/1991 | Pfiester | 437/44 |
| 5,141,890 | 8/1992 | Haken | 437/44 |
| 5,234,850 | 8/1993 | Liao | 437/57 |

*Primary Examiner*—Brian E. Hearn
*Assistant Examiner*—Tuan Nguyen
*Attorney, Agent, or Firm*—Harness, Dickey & Pierce

[57] ABSTRACT

In a method for fabricating a CMOS device with NMOS and PMOS transistors, patterned nitride films are employed in the source/drain ion implantation procedure to reduce the required number of photolithography steps.

2 Claims, 16 Drawing Sheets

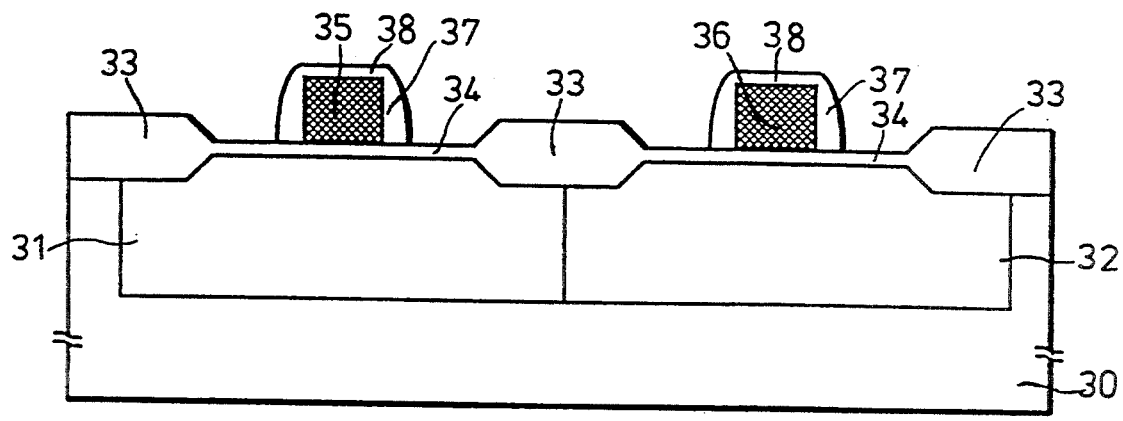
F I G. 16
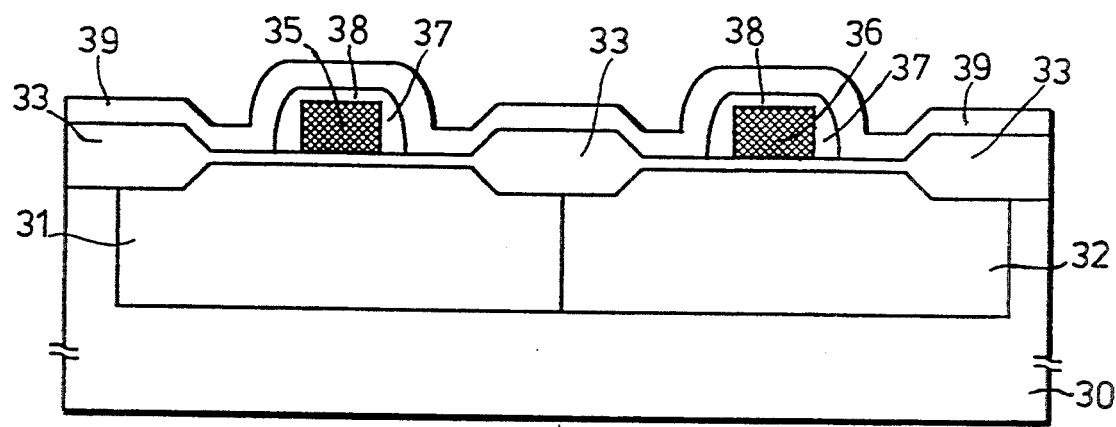
F I G. 17

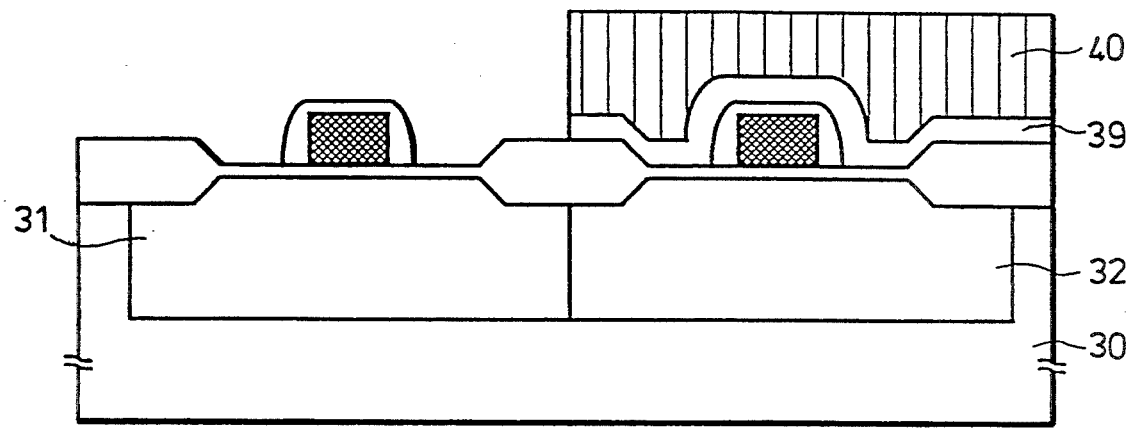
F I G. 20
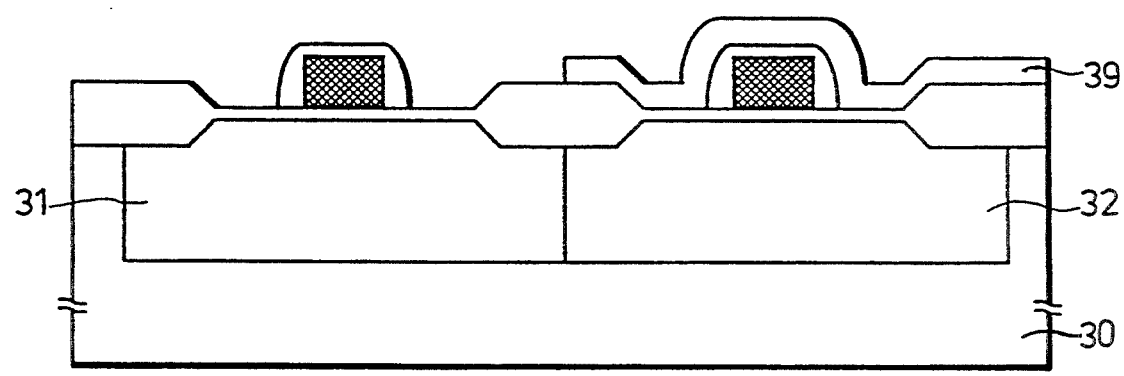
F I G. 21

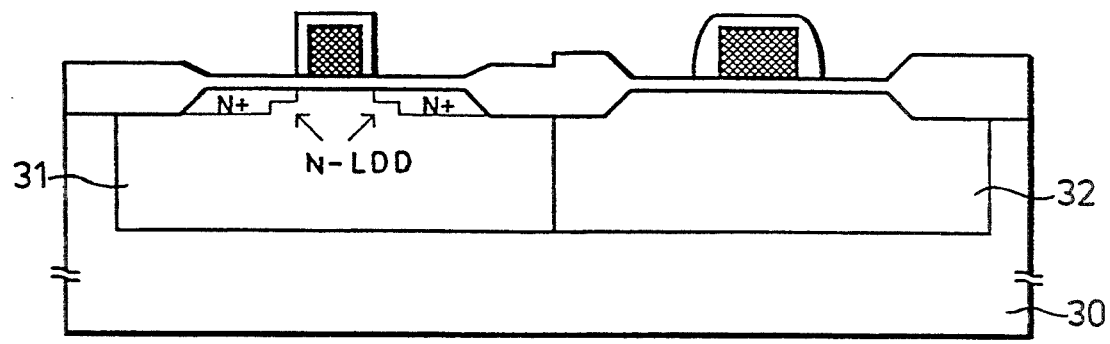
F I G. 26
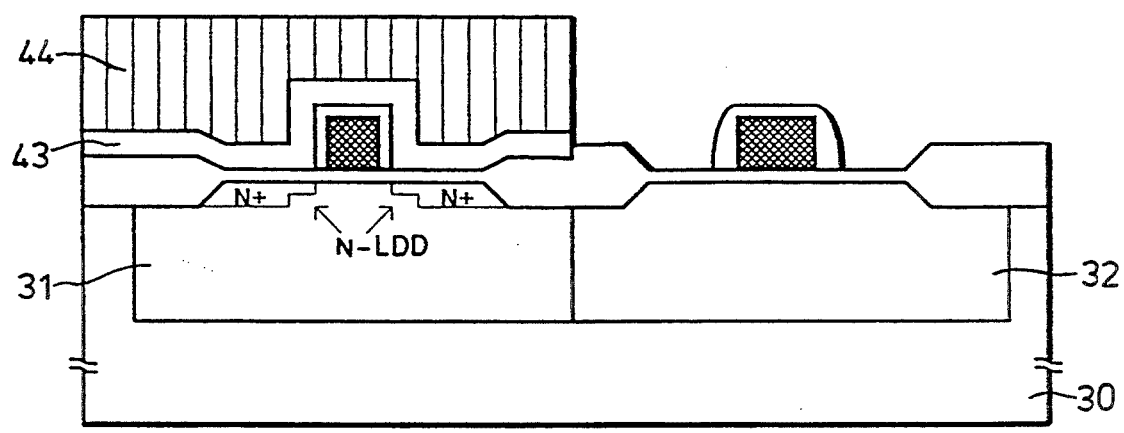
F I G. 27

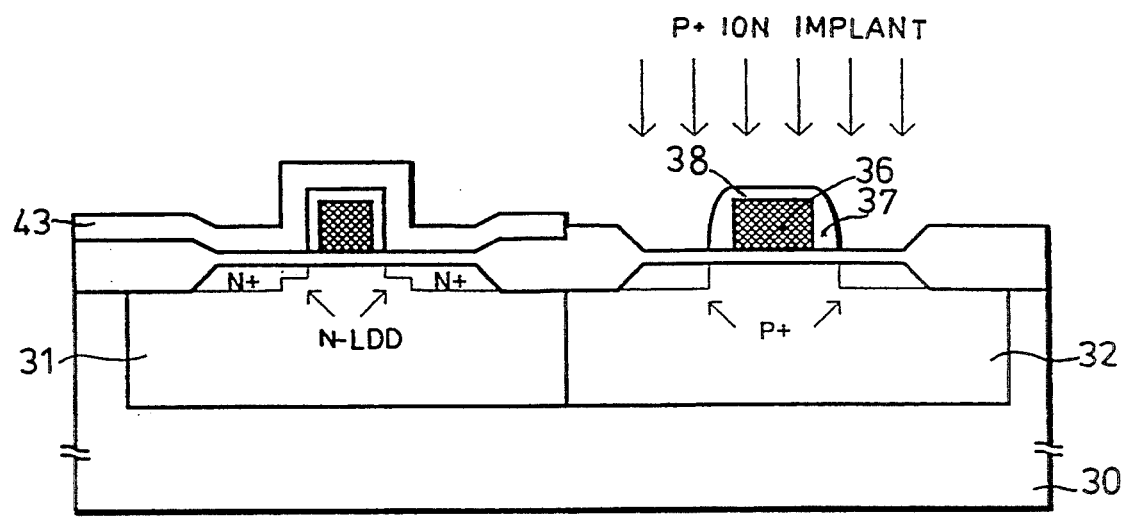
F I G. 28
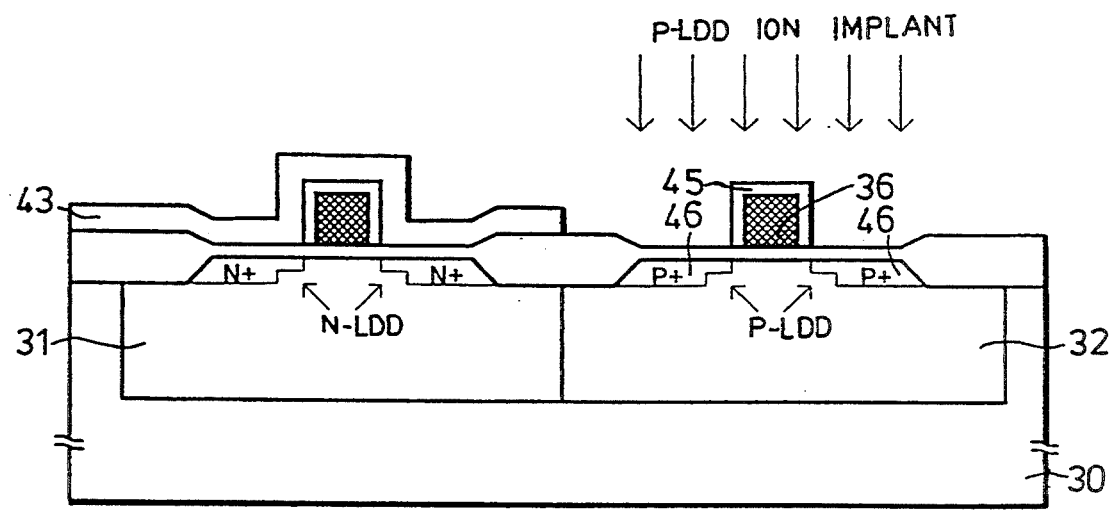
F I G. 29

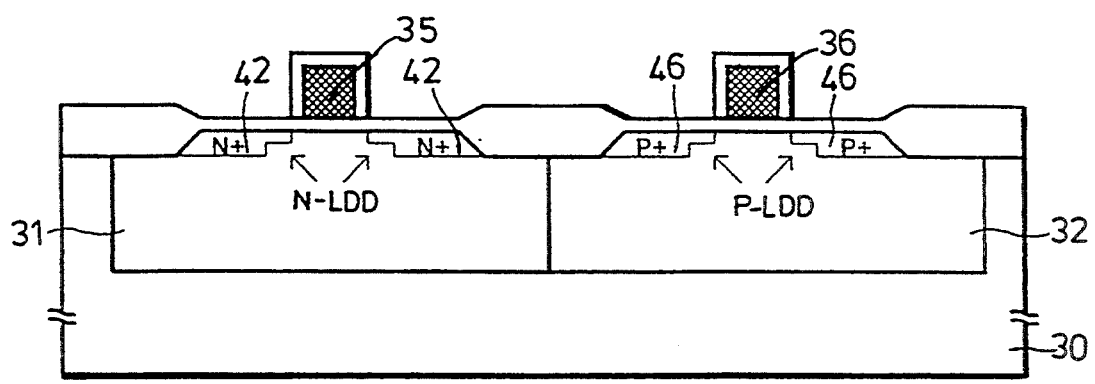
F I G. 30

METHOD FOR FABRICATING A CMOS DEVICE WITH REDUCED NUMBER OF PHOTOLITHOGRAPHY STEPS

BACKGROUND OF THE INVENTION

1. Field of the Invention

The invention relates to a method for fabricating a CMOS device, more particularly to a method for fabricating a CMOS device in which the number of photolithography steps involved during the formation of NMOS and PMOS transistors is minimized.

2. Description of the Related Art

A conventional method for fabricating a CMOS device is described as follows:

Referring to FIG. 1, an intermediate semiconductor device 1 is prepared according to the process steps of the flowchart shown in FIG. 2. Initially, P-type and N-type impurities are implanted into a substrate 10 to form P-type wells 11 for NMOSFETS and N-type wells 12 for PMOSFETS. A silicon nitride layer (not shown) is then deposited over surfaces of the NMOS and PMOS transistor wells 11, 12, and the silicon nitride layer is etched to expose isolation regions around the NMOS and PMOS transistor wells 11, 12. Field oxide layers 13 are then grown on the isolation regions. The silicon nitride layer is removed, and a threshold adjust implant step is performed in order to adjust the threshold voltages of the NMOS and PMOS transistors that are to be formed. A gate oxide layer 14 which overlies the surfaces of the NMOS and PMOS transistor wells 11, 12 is grown, and a polysilicon layer is then deposited on the gate oxide layer 14. The polysilicon layer is etched to form gate electrodes 15, 16 for the NMOS and PMOS transistors. Finally, a first screening oxide 17 is grown and envelops the gate electrodes 15, 16. The intermediate semiconductor device 1 is now ready for source/drain ion implantation.

During the source/drain ion implantation procedure, the surface of the intermediate semiconductor device 1 is coated with a first photoresist layer 18, as shown in FIG. 3. The portion of the first photoresist layer 18 above the NMOS transistor well 11 is patterned through exposure and development, as shown in FIG. 4, and the NMOS transistor well 11 is subjected to N-LDD ion implantation with the patterned first photoresist layer, the polysilicon gate electrode and the field oxide layer as masks, as shown in FIG. 5.

The remaining portion of the first photoresist layer 18 is removed, as shown in FIG. 6, and a second photoresist layer 19 is coated on the surfaces of the NMOS and PMOS transistor wells 11, 12, as shown in FIG. 7. The portion of the second photoresist layer 19 above the PMOS transistor well 12 is patterned through exposure and development, and the PMOS transistor well 12 is subjected to P-LDD ion implantation with the patterned second photoresist layer, the polysilicon gate electrode and the field oxide layer as masks.

Thereafter, the remaining portion of the second photoresist layer 19 is removed, as shown in FIG. 8. A thin layer of oxide is deposited on the surface and is then subjected to an etch-back process to form a sidewall spacer 20 on each side of the gate electrodes 15, 16, as shown in FIG. 9. A second screening oxide 201 is then deposited over the NMOS and PMOS transistor wells 11, 12.

A third photoresist layer 21 is coated on the surfaces of the NMOS and PMOS transistor wells 11, 12, as shown in FIG. 10. The portion of the third photoresist layer 21 above the NMOS transistor well 11 is patterned through exposure and development, and the NMOS transistor well 11 is subjected to N+ ion implantation to form the NMOS source and drain 22 with the patterned third photoresist layer, the polysilicon gate electrode, the sidewall spacer and the field oxide layer as masks.

Next, the remaining portion of the third photoresist layer 21 is removed, as shown in FIG. 11, and a fourth photoresist layer 23 is coated on the surfaces of the NMOS and PMOS transistor wells 11, 12, as shown in FIG. 12. The portion of the fourth photoresist layer 23 above the PMOS transistor well 12 is patterned through exposure and development, and the PMOS transistor well 12 is subjected to P+ ion implantation to form the PMOS source and drain 24 with the patterned fourth photoresist layer, the polysilicon gate electrode, the sidewall spacer and the field oxide layer as masks. Finally, the remaining portion of the fourth photoresist layer 23 is removed, as shown in FIG. 13, thereby completing the source/drain ion implantation procedure of the conventional CMOS fabricating method.

In the fabrication of integrated circuits, the stepper equipment for performing photolithography is considered to be among the most expensive. It is noted that there are four photolithography steps involved in the source/drain ion implantation procedure of the conventional method for fabricating a CMOS device. If the number of photolithography steps in the method for fabricating a CMOS device can be reduced, the number of stepper equipments required in the mass production of CMOS devices can be correspondingly reduced to result in a reduction in the manufacturing cost of the CMOS device.

SUMMARY OF THE INVENTION

Therefore, the object of the present invention is to provide a method for fabricating a CMOS device in which the number of photolithography steps involved during the formation of NMOS and PMOS transistors is minimized to reduce correspondingly the manufacturing cost of the CMOS device.

Accordingly, the method of this invention, which is used for fabricating a CMOS device with NMOS and PMOS transistors, comprises the steps of:

(A) preparing an intermediate semiconductor device, including the steps of: (A-1) implanting P-type and N-type impurity into a substrate to form P-type wells for NMOSFETS and N-type wells for a PMOSFETS; (A-2) depositing a silicon nitride layer over surfaces of the NMOS and PMOS transistor wells; (A-3) etching the silicon nitride layer in order to expose isolation regions around the NMOS and PMOS transistor wells; (A-4) growing field oxide layers on the isolation regions; (A-5) removing the silicon nitride layer; (A-6) growing a gate oxide layer which overlies the surfaces of the NMOS and PMOS transistor wells; (A-7) depositing a polysilicon layer on the gate oxide layer; and (A-8) etching the polysilicon layer to form gate electrodes for the NMOS and PMOS transistors;

(B) forming sidewall spacers on each side of the gate electrodes;

(C) growing a first screening oxide layer on the surfaces of the NMOS and PMOS transistor wells;

(D) depositing a first silicon nitride layer on the surfaces of the NMOS and PMOS transistor wells;

(E) coating a first photoresist layer on the first silicon nitride layer;

(F) patterning the first photoresist layer above a first one of the NMOS and PMOS transistor wells through exposure and development;

(G) etching a portion of the first silicon nitride layer above the first one of the NMOS and PMOS transistor wells to expose heavily-doped source/drain ion implant regions for the first one of the NMOS and PMOS transistor wells;

(H) removing the remaining portion of the first photoresist layer;

(I) subjecting the first one of the NMOS and PMOS transistor wells to N+ ion implantation if the first one of the NMOS and PMOS transistor wells is the NMOS transistor well, and to P+ ion implantation if otherwise;

(J) removing the sidewall spacer at the gate electrode above the first one of the NMOS and PMOS transistor wells;

(K) growing a second screening oxide on the surfaces of the NMOS and PMOS transistor wells;

(L) subjecting the first one of the NMOS and PMOS transistor wells to N-LDD ion implantation if the first one of the NMOS and PMOS transistor wells is the NMOS transistor well, and to P-LDD ion implantation if otherwise;

(M) removing the remaining portion of the first silicon nitride layer;

(N) depositing a second silicon nitride layer on the surfaces of the NMOS and PMOS transistor wells;

(O) coating the second silicon nitride layer with a second photoresist layer;

(P) patterning the second photoresist layer above a second one of the NMOS and PMOS transistor wells through exposure and development;

(Q) etching a portion of the second silicon nitride layer above the second one of the NMOS and PMOS transistor wells to expose heavily-doped source/drain implant regions for the second one of the NMOS and PMOS transistor wells;

(R) removing the remaining portion of the second photoresist layer;

(S) subjecting the second one of the NMOS and PMOS transistor wells to P+ ion implantation if the second one of the NMOS and PMOS transistor wells is the PMOS transistor well, and to N+ ion implantation if otherwise;

(T) etching the sidewall spacer at the gate electrode above the second one of the NMOS and PMOS transistor wells;

(U) growing a third screening oxide on the surfaces of the NMOS and PMOS transistor wells;

(V) subjecting the second one of the NMOS and PMOS transistor wells to P-LDD ion implantation if the second one of the NMOS and PMOS transistor wells is the PMOS transistor well, and to N-LDD ion implantation if otherwise; and (W) removing the remaining portion of the second silicon nitride layer.

BRIEF DESCRIPTION OF THE DRAWINGS

Other features and advantages of the present invention will become apparent in the following detailed description of the preferred embodiment, with reference to the accompanying drawings, of which:

FIGS. 14 to 30 illustrate the preferred embodiment of a method for fabricating a CMOS device in accordance with this invention.

DETAILED DESCRIPTION OF THE PREFERRED EMBODIMENT

Figure 1:
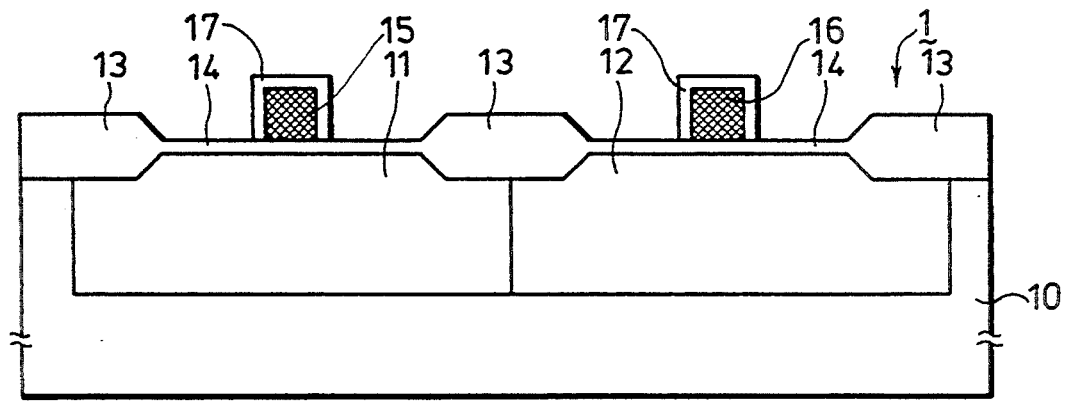
FIG. 1 is a schematic view of an intermediate semiconductor device which is obtained in a conventional method for fabricating a CMOS device.
Figure 3:
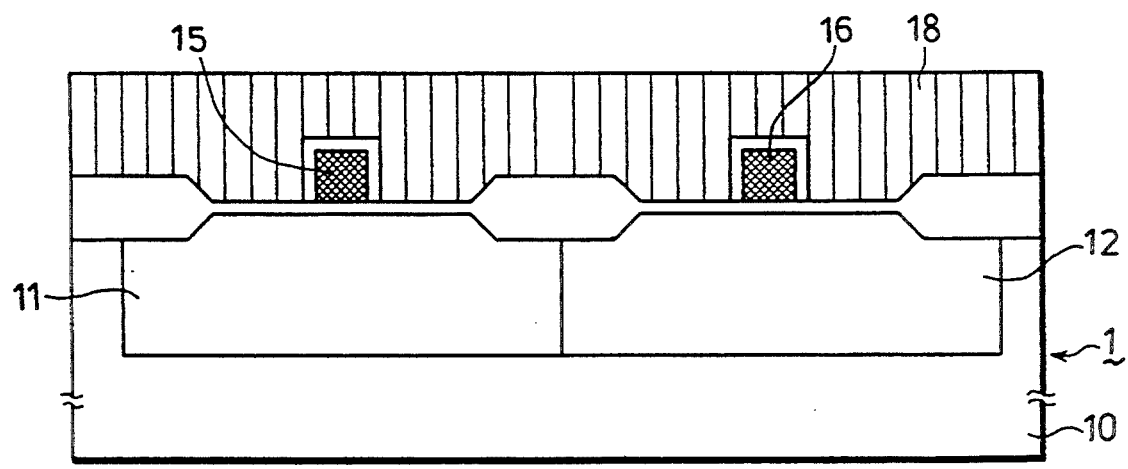
FIGS. 3 to 13 illustrate the source/drain ion implantation procedure for the intermediate semiconductor device of FIG. 1 in accordance with the conventional method for fabricating a CMOS device.
Figure 2:
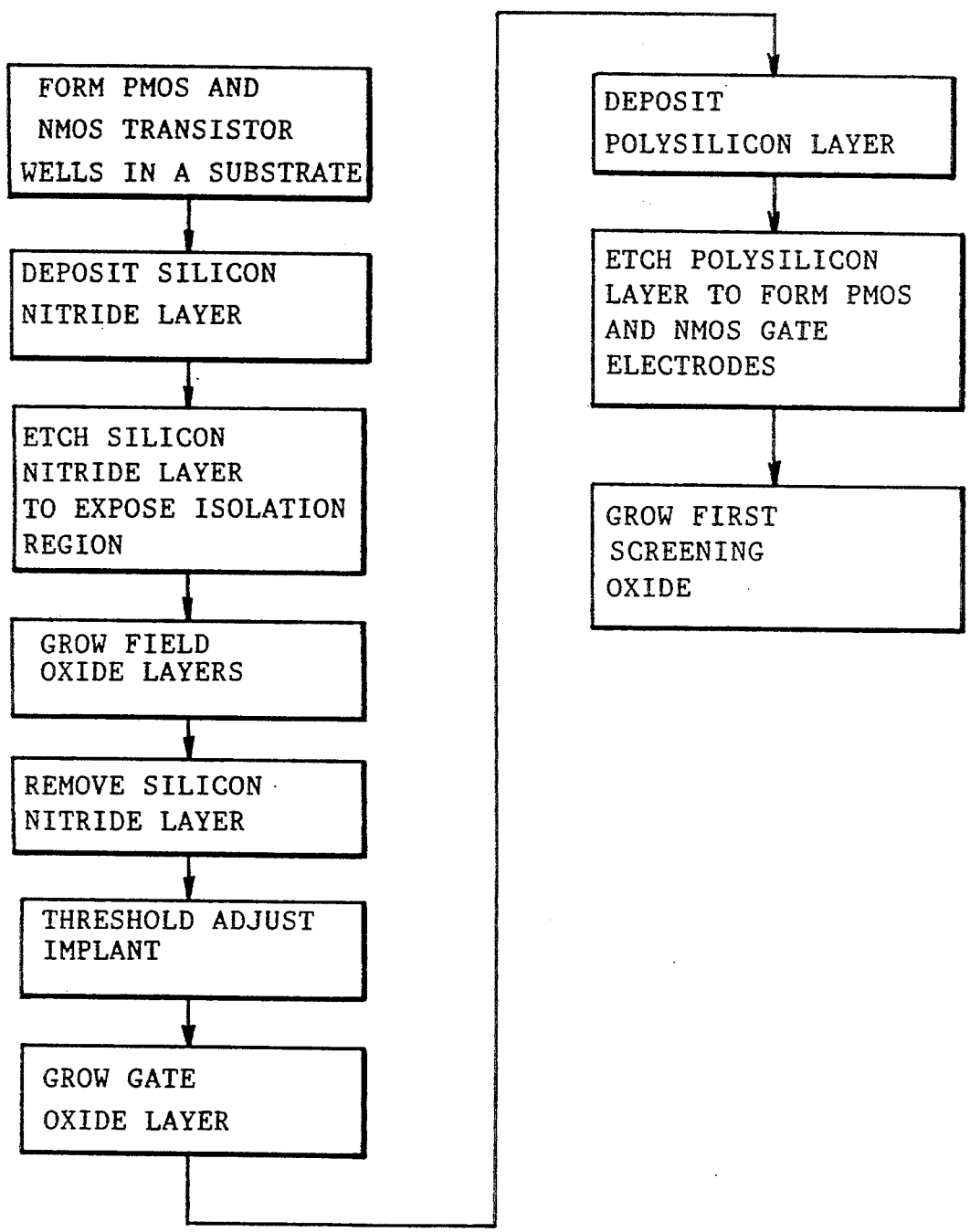
FIG. 2 is a flowchart illustrating the process steps for fabricating the intermediate semiconductor device shown in FIG. 1.
Figure 4:
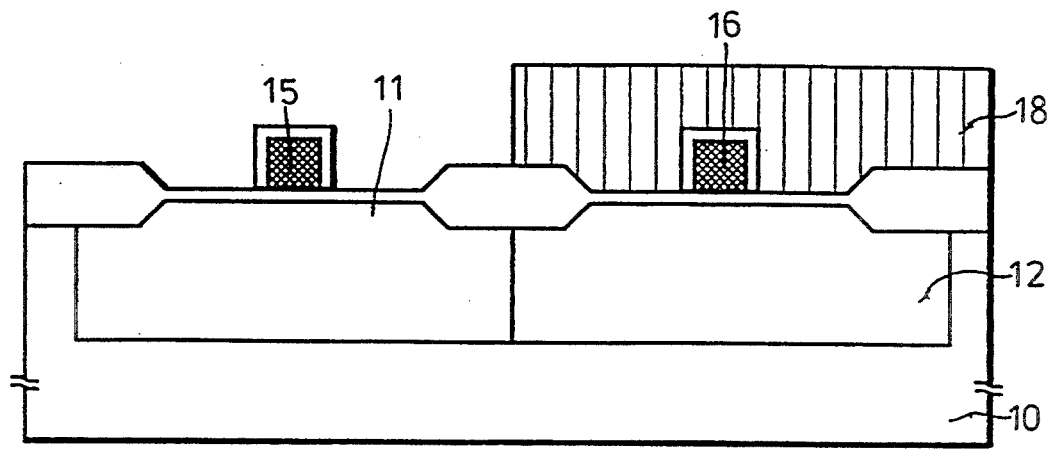
Figure 5:
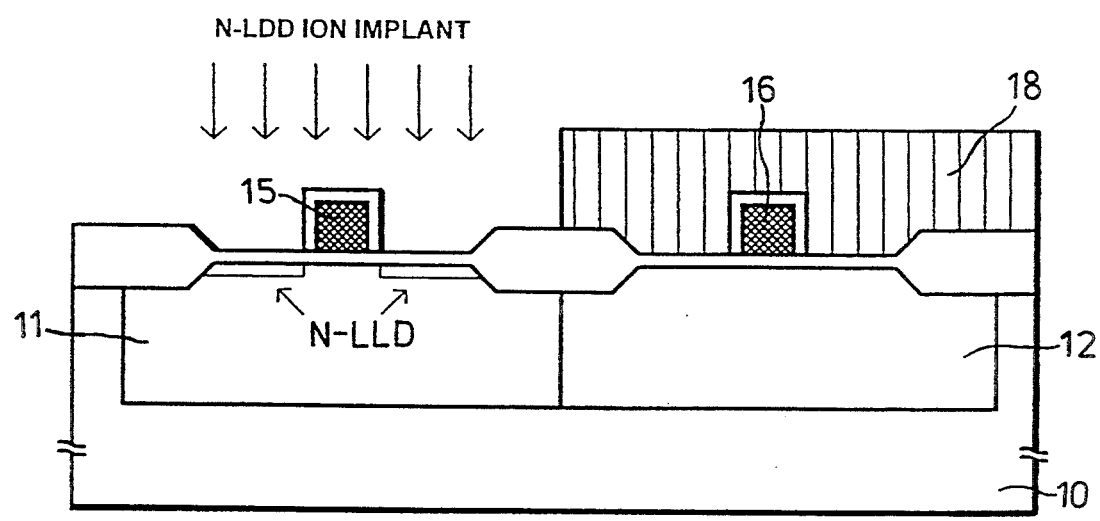
Figure 6:
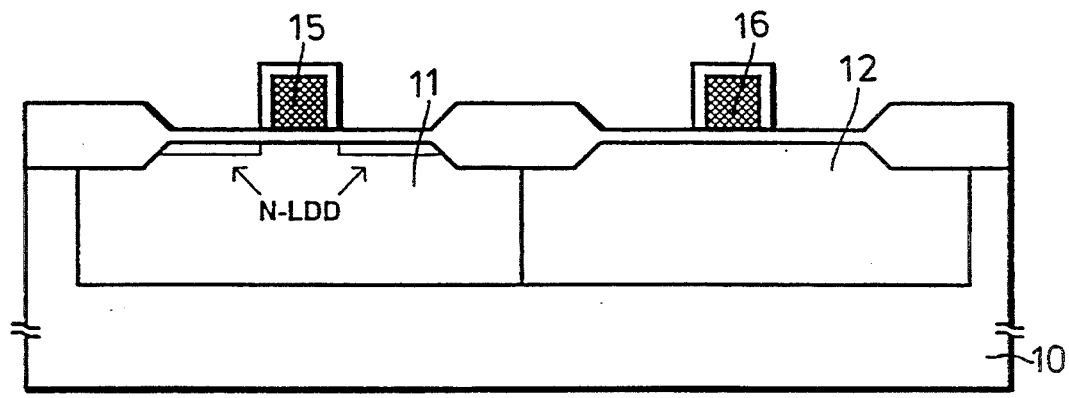
Figure 7:
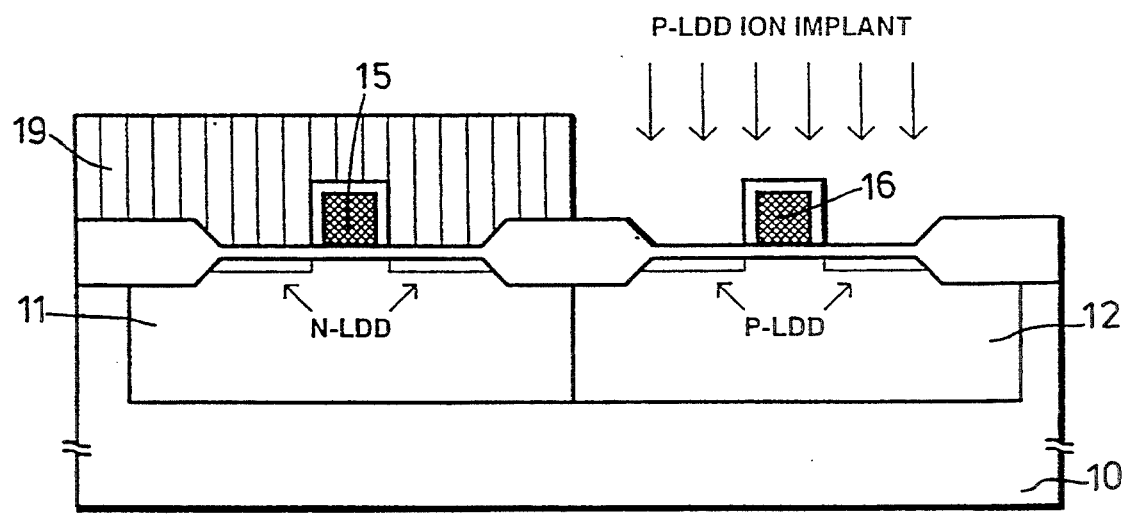
Figure 8:
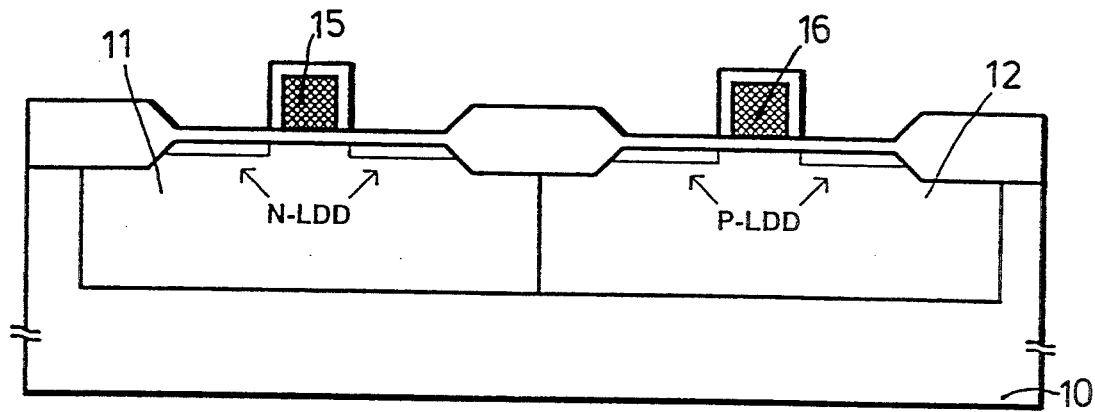
Figure 9:
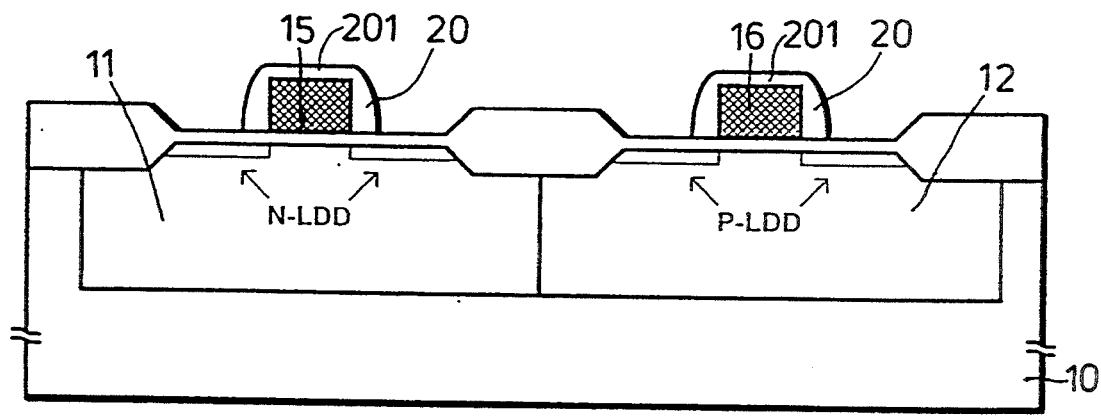
Figure 10:
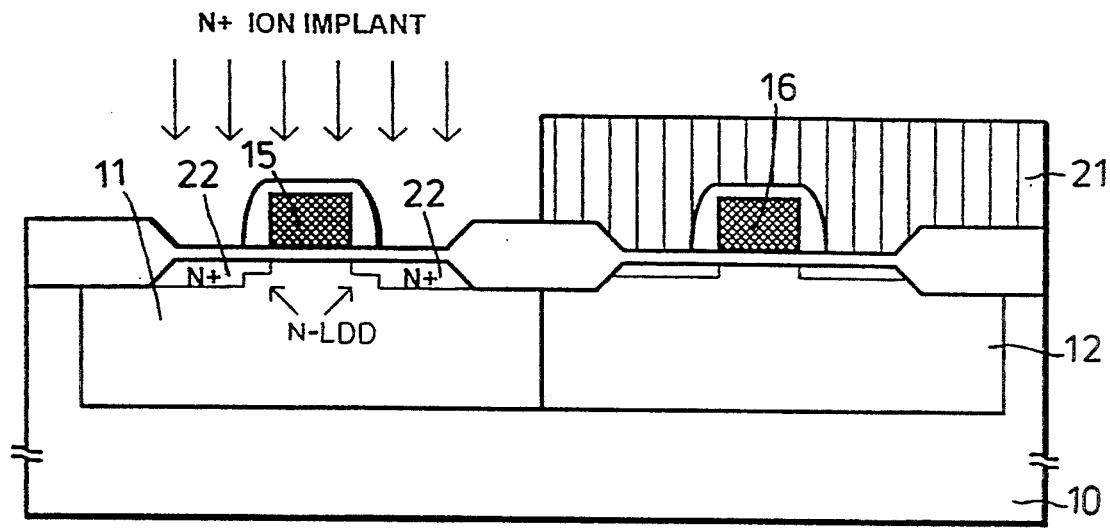
Figure 11:
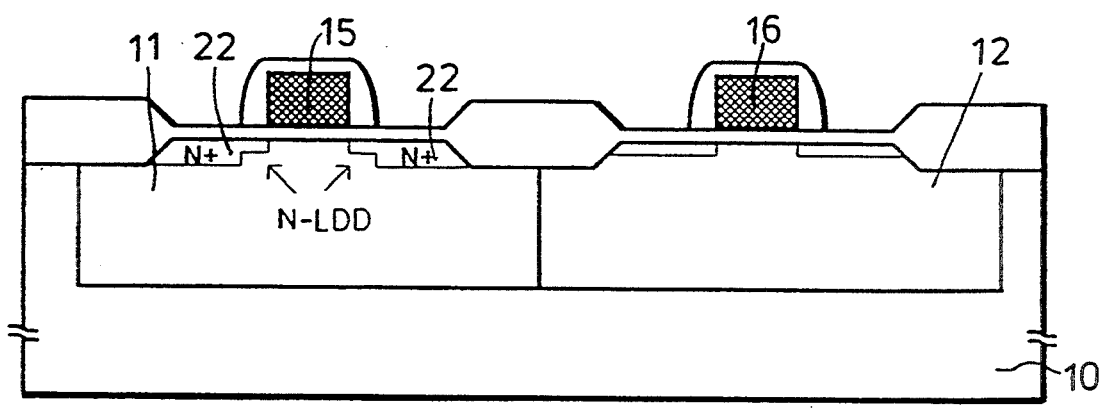
Figure 12:
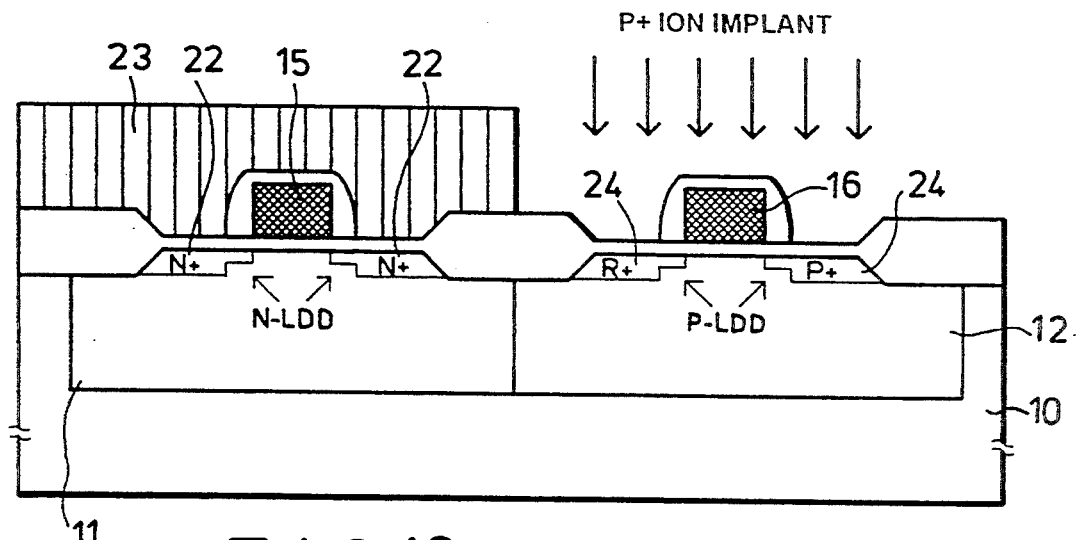
Figure 13:
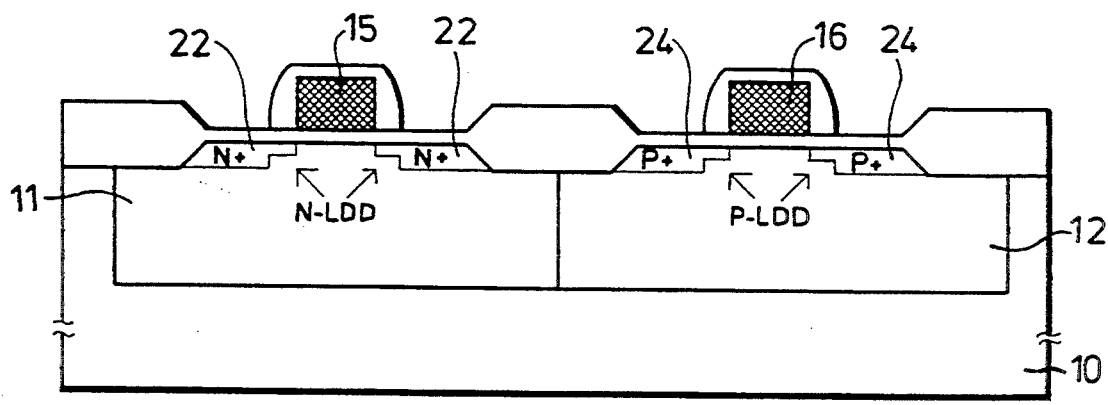
Figure 14:
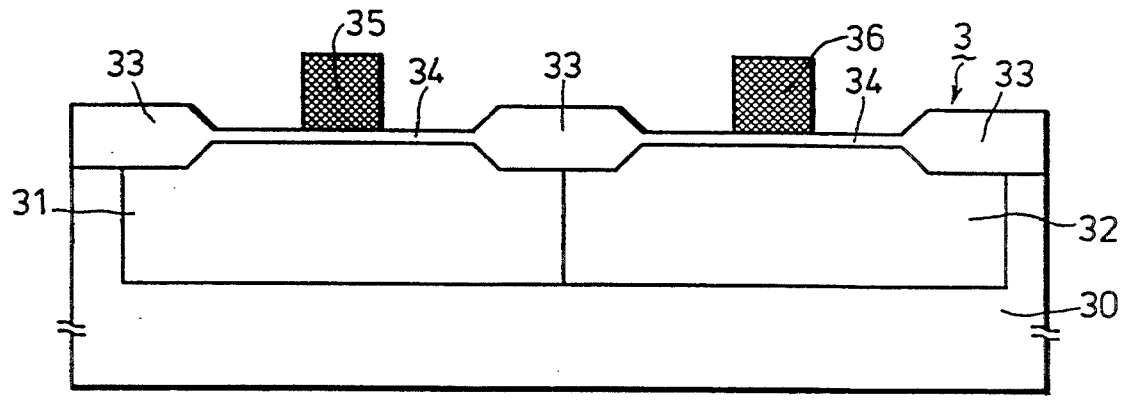

The preferred embodiment of the method of this invention for fabricating a CMOS device will now be described as follows:

Referring to FIG. 14, an intermediate semiconductor device 3 is prepared in a manner similar to that of the conventional intermediate semiconductor device 1. Initially, P-type and N-type impurities are implanted into a substrate 30 to form P-type wells 31 for NMOS-FETS and N-type wells 32 for PMOSFETS. A silicon nitride layer (not shown) is then deposited over surfaces of the NMOS and PMOS transistor wells 31, 32, and the silicon nitride layer is etched in order to expose isolation regions around the NMOS and PMOS transistor wells 31, 32. Field oxide layers 33 are then grown on the isolation regions. The silicon nitride layer is removed, and a threshold adjust implant step is performed in order to adjust the threshold voltages of the NMOS and PMOS transistors that are to be formed. A gate oxide layer 34 which overlies the surfaces of the NMOS and PMOS transistor wells 31, 32 is grown, and a polysilicon layer is then deposited on the gate oxide layer 34. The polysilicon layer is etched to form gate electrodes 35, 36 for the NMOS and PMOS transistors.

Figure 15:
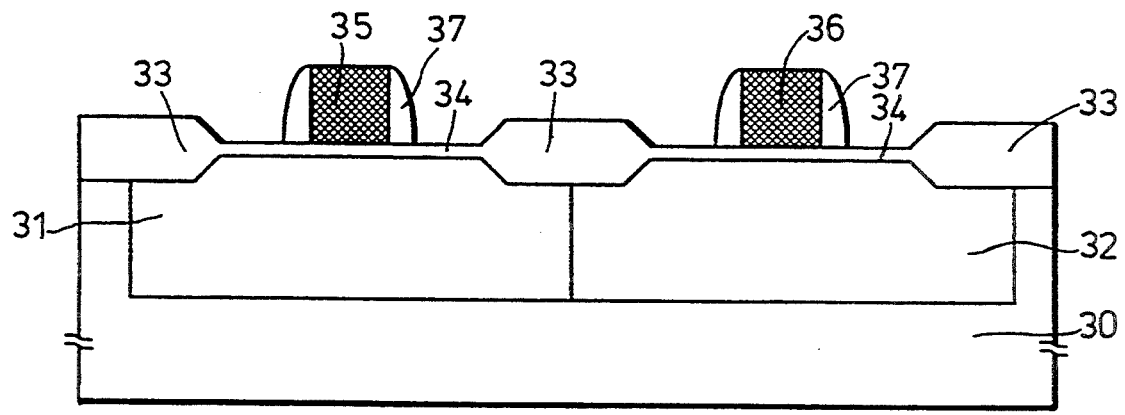

After the intermediate semiconductor device 3 has been prepared, an oxide layer, such as low temperature oxide (LTO) or TEOS, is deposited thereon. The oxide layer is etched, such as by known dry etching techniques, to form sidewall spacers 37 on each side of the gate electrodes 35, 36, as shown in FIG. 15. A first screening oxide layer 38 is then grown on the surfaces of the NMOS and PMOS transistor wells 31, 32, as shown in FIG. 16.

Figure 18:
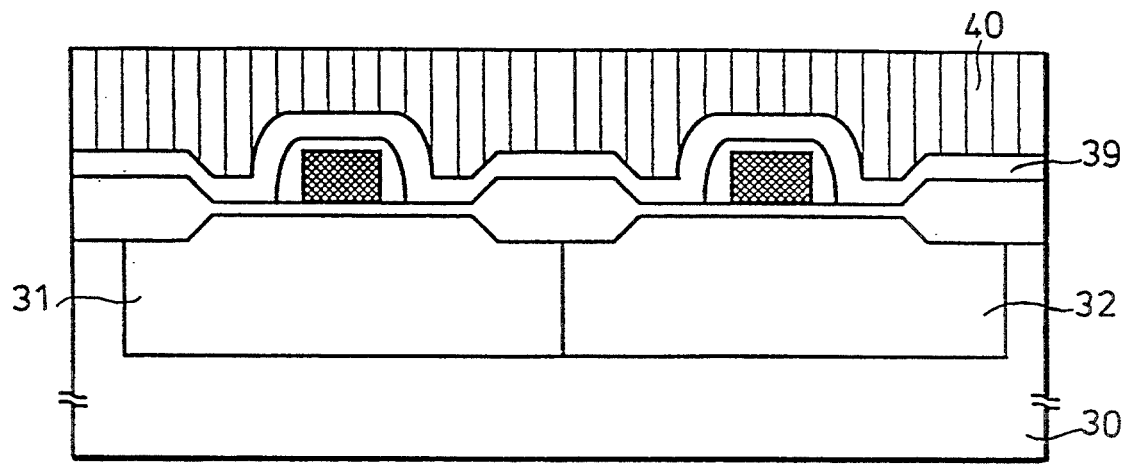
Figure 19:
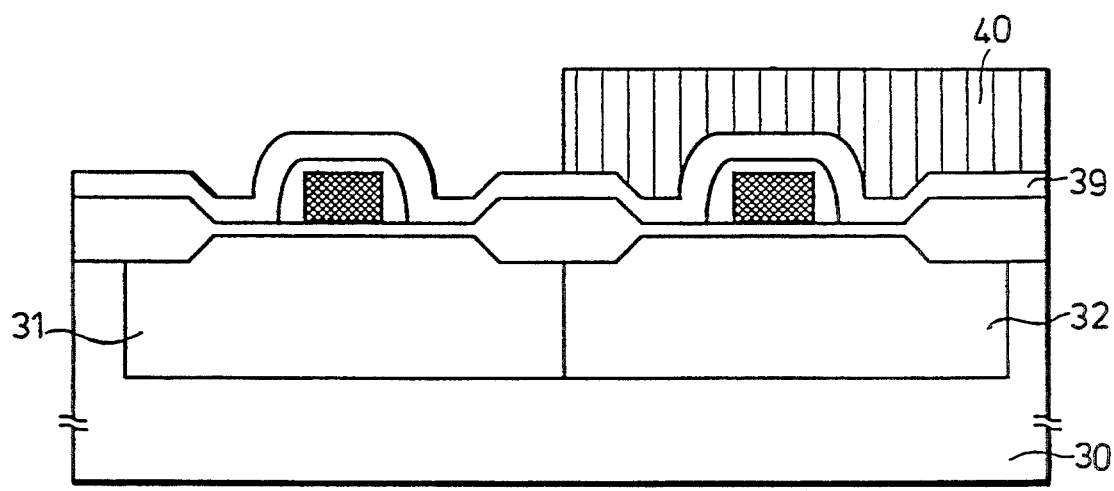

Referring to FIG. 17, a first silicon nitride layer 39, with a thickness of about 1500-2000 Å, is deposited on the surfaces of the NMOS and PMOS transistor wells 31, 32 through known low-stress PECVD nitride deposition techniques. The first silicon nitride layer 39 is coated with a first photoresist layer 40, as shown in FIG. 18, and the first photoresist layer 40 above the NMOS transistor well 31 is patterned by exposure and development, as shown in FIG. 19. The portion of the first silicon nitride layer 39 above the NMOS transistor well 31 is then etched, such as by dry etching, to expose N+ implant regions for the NMOS transistor well 31, as shown in FIG. 20. Subsequently, the remaining portion of the first photoresist layer 40 is removed, as shown in FIG. 21. The portion of the first silicon nitride layer 39 above the PMOS transistor well 32 serves as a nitride mask therefor.

Figure 22:
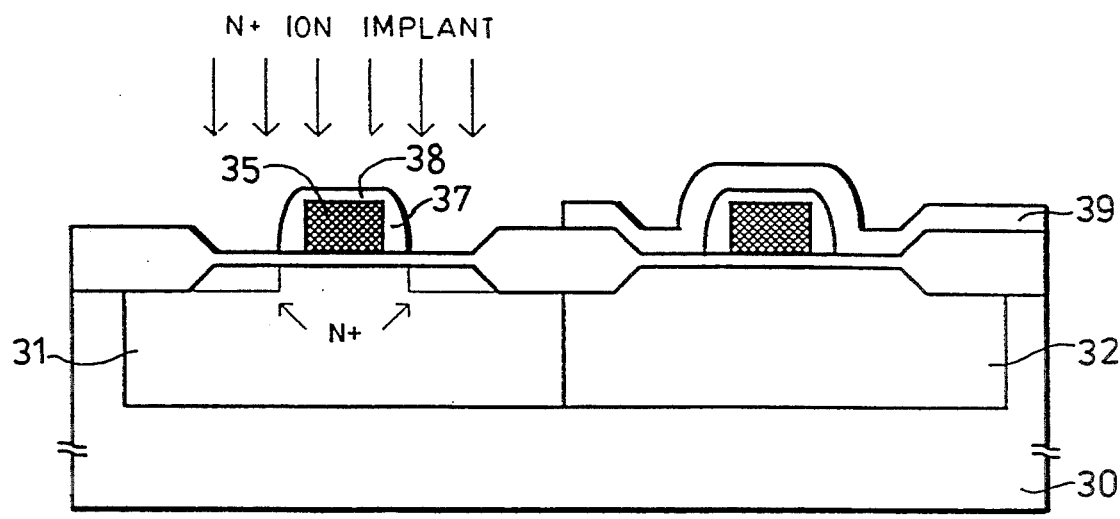
Figure 23:
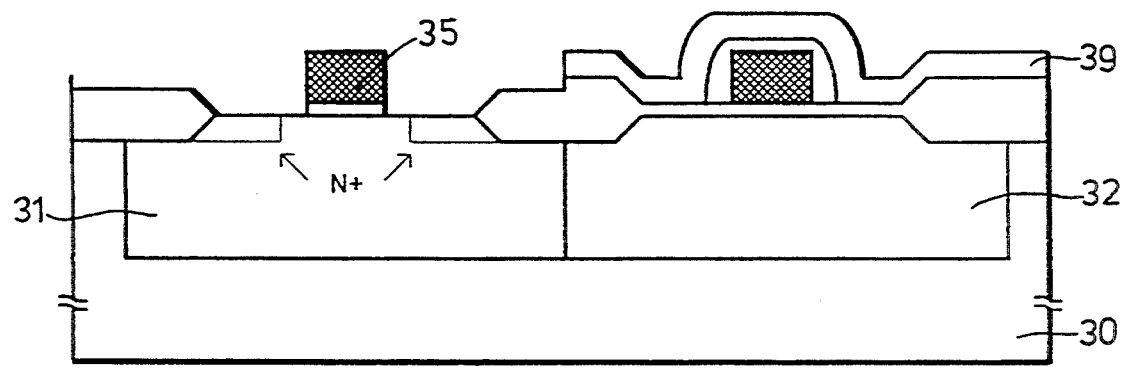
Figure 24:
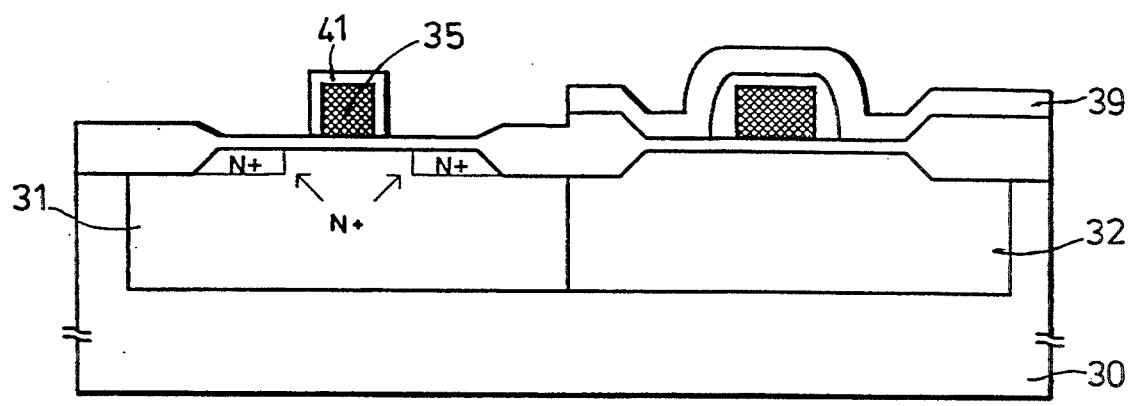
Figure 25:
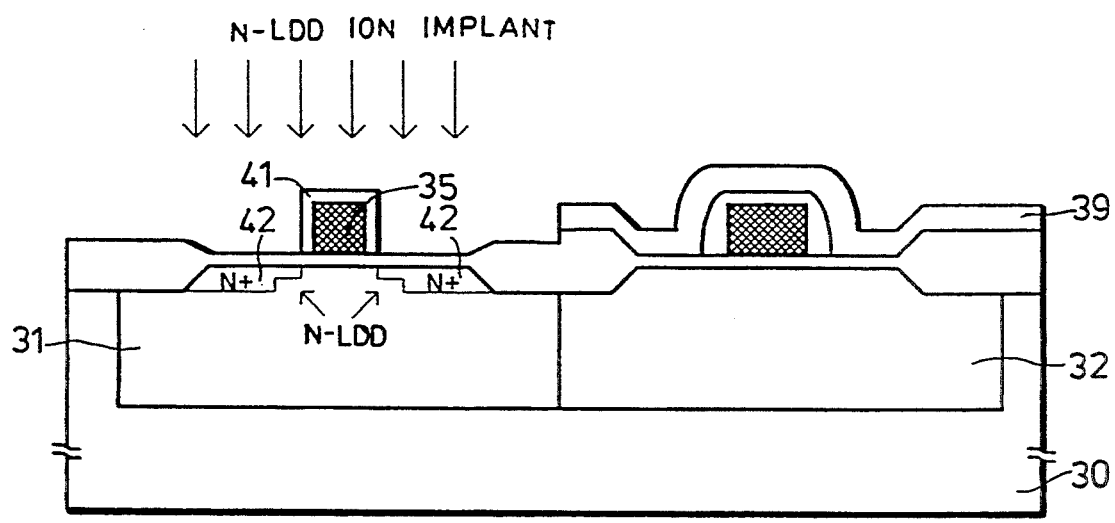

Referring to FIG. 22, the NMOS transistor well 31 is subjected to high dose arsenic (N+) ion implantation with the patterned first nitride layer, the polysilicon gate electrode, the sidewall spacer and the field oxide layer as masks. Thereafter, the oxide layer around the gate electrode 35 above the NMOS transistor well 31, including the sidewall spacer 37 and the first screening oxide 38, is removed through known wet or dry etching techniques, as shown in FIG. 23, and a second screening oxide 41 is then grown, as shown in FIG. 24. The NMOS transistor well 31 is then subjected to low dose phosphorous (N-LDD) ion implantation with the patterned first nitride layer, the polysilicon gate electrode, the sidewall spacer and the field oxide layer as masks, thereby forming the source and drain 42 of the NMOS transistor, as shown in FIG. 25.

Referring to FIG. 26, prior to forming the source and drain of the PMOS transistor, the remaining portion of the first silicon nitride layer 39 is removed, such as by using high-temperature phosphoric acid. A second silicon nitride layer 43 with a thickness of about 1500–2000 Å is deposited on the surfaces of the NMOS and PMOS transistor wells 31, 32, also through low-stress PECVD nitride deposition, as shown in FIG. 27. The second silicon nitride layer 43 is coated with a second photoresist layer 44, and the second photoresist layer 44 above the PMOS transistor well 32 is patterned by exposure and development. The portion of the second silicon nitride layer 43 above the PMOS transistor well 32 is then etched, such as by dry etching, to expose P+ implant regions for the PMOS transistor well 32.

Subsequently, the remaining portion of the second photoresist layer 44 is removed, as shown in FIG. 28. The portion of the second silicon nitride layer 43 above the NMOS transistor well 31 serves as a nitride mask therefor. The PMOS transistor well 32 is then subjected to high dose boron (P+) ion implantation, with the patterned second nitride layer, the polysilicon gate electrode, the sidewall spacer and the field oxide layer as masks. Thereafter, the oxide layer around the gate electrode 36 above the PMOS transistor well 32, including the sidewall spacer 37 and the first screening oxide 38, is removed through wet or dry etching techniques, as shown in FIG. 29, and a third screening oxide layer 45 is grown. The PMOS transistor well 32 is then subjected to low dose BF$_2$ (P-LDD) ion implantation, with the patterned second nitride layer, the polysilicon gate electrode and the field oxide layer as masks, thereby forming the source and drain 46 of the PMOS transistor. Finally, the remaining portion of the second silicon nitride layer 43 is removed through the use of high-temperature phosphoric acid, as shown in FIG. 30, thus completing the source/drain ion implantation procedure of the CMOS fabricating method of this invention.

It is noted that, when compared to the previously described conventional method for fabricating a CMOS device, the method of the present invention employs a fewer number of photolithography steps. However, two nitride deposition steps, two nitride etching steps, two nitride removal steps, two spacer removal steps and an additional screening oxide formation step were added to compensate for the fewer number of photolithography steps. Since these additional steps can be conveniently performed and are inexpensive to conduct due to the avoidance of any high precision requirement, the method of this invention can be used to fabricate CMOS devices at a lower manufacturing cost.

While the present invention has been described in connection with what is considered the most practical and preferred embodiment, it is understood that this invention is not limited to the disclosed embodiment, but is intended to cover various arrangements included within the spirit and scope of the broadest interpretation so as to encompass all such modifications and equivalent arrangements.

I claim:

1. A method for fabricating a CMOS device with NMOS and PMOS transistors, said method comprising the steps of:
   (A) preparing an intermediate semiconductor device, including the steps of: (A-1) implanting P-type and N-type impurity into a substrate to form NMOS and PMOS transistor wells; (A-2) depositing a silicon nitride layer over surfaces of said NMOS and PMOS transistor wells; (A-3) etching said silicon nitride layer in order to expose isolation regions around said NMOS and PMOS transistor wells; (A-4) growing field oxide layers on said isolation regions; (A-5) removing said silicon nitride layer; (A-6) growing a gate oxide layer which overlies said surfaces of said NMOS and PMOS transistor wells; (A-7) depositing a polysilicon layer on said gate oxide layer; and (A-8) etching said polysilicon layer to form gate electrodes for said NMOS and PMOS transistors;
   (B) forming sidewall spacers on each side of said gate electrodes;
   (C) growing a first screening oxide layer on said surfaces of said NMOS and PMOS transistor wells;
   (D) depositing a first silicon nitride layer on said surfaces of said NMOS and PMOS transistor wells;
   (E) coating a first photoresist layer on said first silicon nitride layer;
   (F) patterning said first photoresist layer above a first one of said NMOS and PMOS transistor wells by exposure and development;
   (G) etching a portion of said first silicon nitride layer above said first one of said NMOS and PMOS transistor wells to expose ion implant regions for said first one of said NMOS and PMOS transistor wells;
   (H) removing the remaining portion of said first photoresist layer;
   (I) subjecting said first one of said NMOS and PMOS transistor wells to N+ ion implantation if said first one of said NMOS and PMOS transistor wells is said NMOS transistor well, and to P+ ion implantation if otherwise;
   (J) etching said sidewall spacer at said gate electrode above said first one of said NMOS and PMOS transistor wells;
   (K) growing a second screening oxide on said surfaces of said NMOS and PMOS transistor wells;
   (L) subjecting said first one of said NMOS and PMOS transistor wells to N-LDD ion implantation if said first one of said NMOS and PMOS transistor wells is said NMOS transistor well, and to P-LDD ion implantation if otherwise; and
   (M) removing the remaining portion of said first silicon nitride layer.

2. The method for fabricating a CMOS device as claimed in claim 1, further comprising the steps of:
   (N) depositing a second silicon nitride layer on said surfaces of said NMOS and PMOS transistor wells;
   (O) coating said second silicon nitride layer with a second photoresist layer;
   (P) patterning said second photoresist layer above a second one of said NMOS and PMOS transistor wells by exposure and development;
   (Q) etching a portion of said second silicon nitride layer above said second one of said NMOS and PMOS transistor wells to expose implant regions for said second one of said NMOS and PMOS transistor wells;

(R) removing the remaining portion of said second photoresist layer;

(S) subjecting said second one of said NMOS and PMOS transistor wells to P+ ion implantation if said second one of said NMOS and PMOS transistor wells is said PMOS transistor well, and to N+ ion implantation if otherwise;

(T) etching said sidewall spacer at said gate electrode above said second one of said NMOS and PMOS transistor wells;

(U) growing a third screening oxide on said surfaces of said NMOS and PMOS transistor wells;

(V) subjecting said second one of said NMOS and PMOS transistor wells to P-LDD ion implantation if said second one of said NMOS and PMOS transistor wells is said PMOS transistor well, and to N-LDD ion implantation if otherwise; and (W) removing the remaining portion of said second silicon nitride layer.

* * * * *